United States Patent
Dudnikov, Jr. et al.

(10) Patent No.: US 7,593,203 B2
(45) Date of Patent: Sep. 22, 2009

(54) SELECTIVE DEPOSITION OF EMBEDDED TRANSIENT PROTECTION FOR PRINTED CIRCUIT BOARDS

(75) Inventors: George Dudnikov, Jr., San Jose, CA (US); Franz Gisin, San Jose, CA (US); Gregory J. Schroeder, Morgan Hill, CA (US)

(73) Assignee: Sanmina-SCI Corporation, San Jose, CA (US)

( * ) Notice: Subject to any disclaimer, the term of this patent is extended or adjusted under 35 U.S.C. 154(b) by 302 days.

(21) Appl. No.: 11/357,618

(22) Filed: Feb. 16, 2006

(65) Prior Publication Data

US 2006/0181827 A1 Aug. 17, 2006

Related U.S. Application Data

(60) Provisional application No. 60/653,723, filed on Feb. 16, 2005.

(51) Int. Cl.
*H01H 47/00* (2006.01)
(52) U.S. Cl. .................................... 361/56; 361/220
(58) Field of Classification Search ............... 361/56, 361/91.1, 111, 117, 119, 212, 220
See application file for complete search history.

(56) References Cited

U.S. PATENT DOCUMENTS

| | | | |
|---|---|---|---|
| 4,133,735 A | 1/1979 | Afromowitz et al. | |
| 4,628,022 A | 12/1986 | Ors et al. | |
| 4,996,587 A | 2/1991 | Hinrichsmeyer et al. | |
| 5,010,641 A * | 4/1991 | Sisler | 29/830 |
| 5,260,848 A | 11/1993 | Childers | |
| 5,380,679 A | 1/1995 | Kano | |
| 5,382,928 A | 1/1995 | Davis et al. | |
| 5,516,705 A * | 5/1996 | Webb et al. | 438/133 |
| 5,532,899 A | 7/1996 | Tarbouriech | |
| 5,796,570 A * | 8/1998 | Mekdhanasarn et al. | 361/126 |
| 5,807,509 A | 9/1998 | Shrier et al. | |
| 5,906,042 A * | 5/1999 | Lan et al. | 29/852 |
| 6,064,094 A | 5/2000 | Intrater et al. | |
| 6,130,459 A | 10/2000 | Intrater | |
| 6,160,695 A | 12/2000 | Winnett et al. | |
| 6,172,590 B1 | 1/2001 | Shrier et al. | |
| 6,210,537 B1 * | 4/2001 | Murphy et al. | 204/157.15 |
| 6,239,687 B1 | 5/2001 | Shrier et al. | |
| 6,310,752 B1 | 10/2001 | Shrier et al. | |
| 6,323,599 B1 | 11/2001 | Orchard-Webb | |
| 6,329,603 B1 | 12/2001 | Japp et al. | |
| 6,373,719 B1 | 4/2002 | Behling et al. | |
| 6,382,997 B2 | 5/2002 | Semmeling et al. | |
| 6,433,394 B1 | 8/2002 | Intrarer et al. | |
| 6,542,065 B2 | 4/2003 | Shrier et al. | |
| 6,549,114 B2 | 4/2003 | Whitney et al. | |
| 6,570,765 B2 | 5/2003 | Behling et al. | |
| 6,657,532 B1 | 12/2003 | Shrier et al. | |
| 6,693,508 B2 | 2/2004 | Whitney et al. | |
| 6,797,145 B2 * | 9/2004 | Kosowsky | 205/221 |
| 7,258,819 B2 | 8/2007 | Harris, IV | |
| 7,446,030 B2 | 11/2008 | Kosowsky | |
| 2001/0019916 A1 | 9/2001 | Semmeling et al. | |
| 2004/0079927 A1 | 4/2004 | Kwon et al. | |

(Continued)

OTHER PUBLICATIONS

Office Action mailed Oct. 29, 2008 for U.S. Appl. No. 11/356,562, published as US patent publication No. 20060181826 A1.

(Continued)

*Primary Examiner*—Danny Nguyen
(74) *Attorney, Agent, or Firm*—Loza & Loza, LLP; Julio M. Loza

(57) ABSTRACT

Protection for sensitive components on a printed circuit board by selectively depositing transient protection material on one or more layers of the printed circuit board is disclosed.

21 Claims, 10 Drawing Sheets

U.S. PATENT DOCUMENTS

| | | |
|---|---|---|
| 2004/0160300 A1 | 8/2004 | Shrier |
| 2004/0183135 A1 | 9/2004 | Kwon et al. |
| 2005/0029595 A1 | 2/2005 | Rodov et al. |
| 2005/0083163 A1 | 4/2005 | Shrier |
| 2006/0181826 A1 | 8/2006 | Dudnikov, Jr. et al. |

OTHER PUBLICATIONS

International Search Report, PCT International Preliminary Report on Patentability, and PCT Written Opinion of the International Searching Authority for PCT application No. US2006005639.

International Search Report and PCT Written Opinion of the International Searching Authority for PCT application No. US0605984.

Office Action Mailed Dec. 11, 2008 for U.S. Appl. No. 11/369,448, filed Mar. 6, 2006.

U.S. Appl. No. 11/369,448, filed Mar. 6, 2006.

Office Action mailed May 5, 2009 for U.S. Appl. No. 11/356,562, filed Feb. 16, 2006.

* cited by examiner

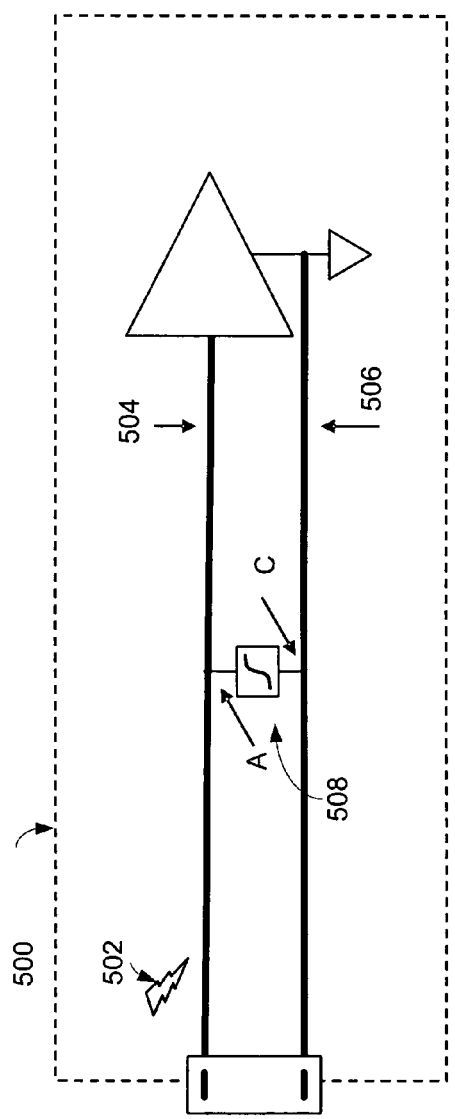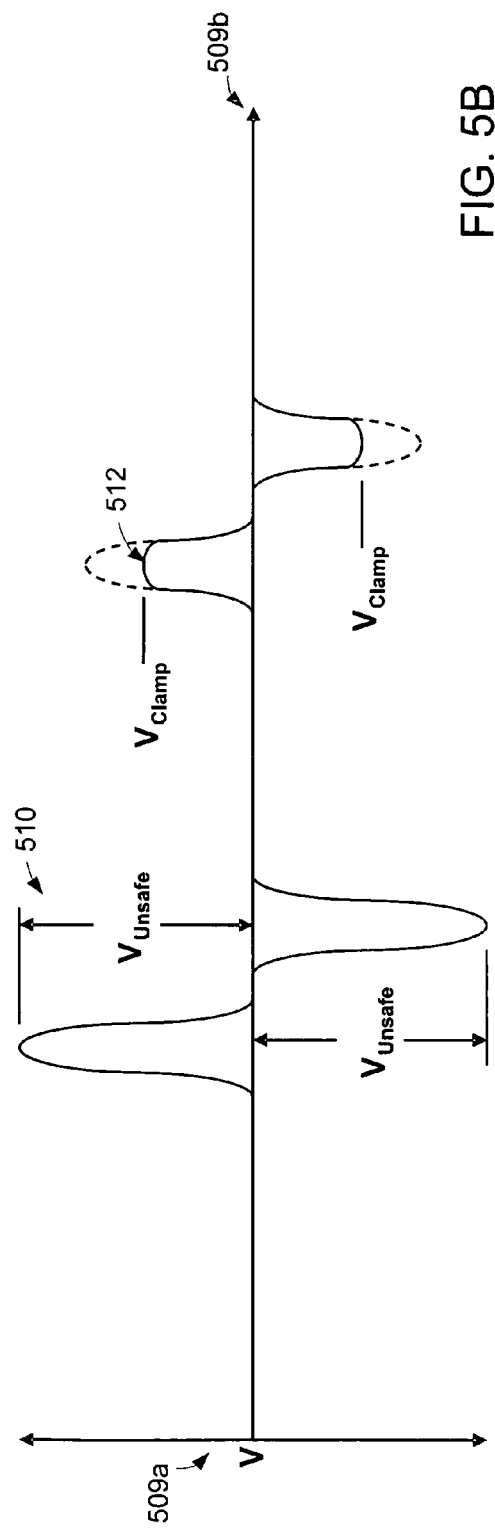
FIG. 5A
FIG. 5B

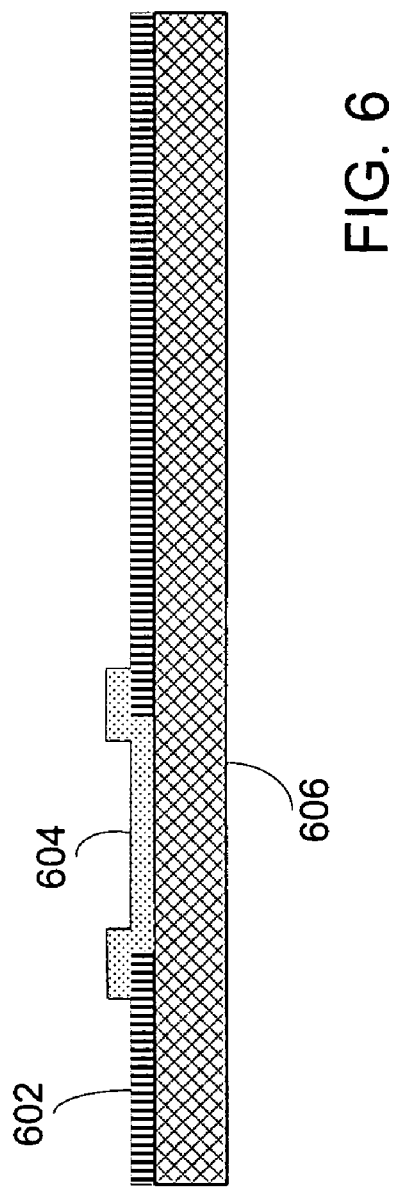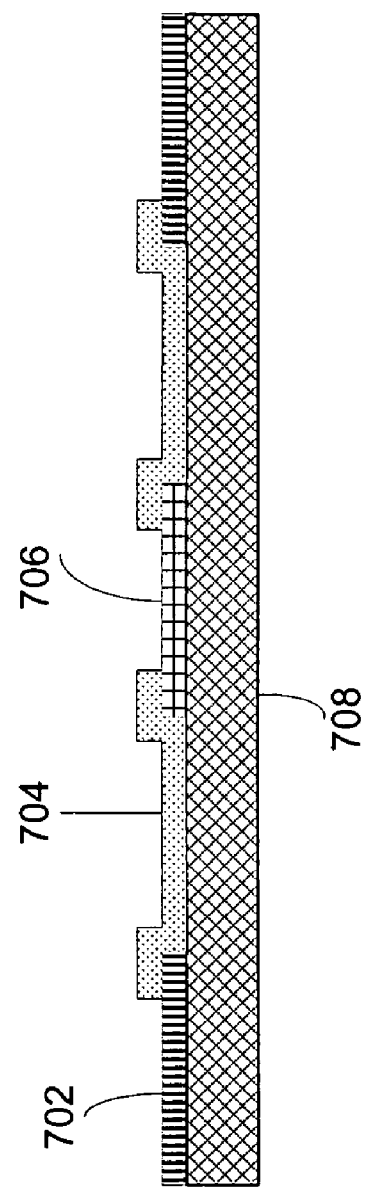

SELECTIVE DEPOSITION OF EMBEDDED TRANSIENT PROTECTION FOR PRINTED CIRCUIT BOARDS

CROSS REFERENCE TO RELATED APPLICATION(S)

This application claims the benefit of U.S. Ser. No. 60/653,723, filed Feb. 16, 2005, incorporated herein by reference in its entirety. The present application is related to the application entitled, "A Substantially Continuous Layer of Embedded Transient Protection For Printed Circuit Boards" by Dudnikov et al., which is concurrently filed and the entire contents of which are hereby incorporated by reference as if fully set forth herein.

BACKGROUND

Printed circuit boards, backplanes, midplanes, printed wiring boards, flex circuits, rigid flex-circuits, multi-chip modules (MCM), interposers and the like are herein referred to collectively as "PCBs".

A via structure typically provides a conductive path between conductive layers in the z-axis direction (orthogonal to the x-y plane of a PCB). Via holes are formed by a variety of techniques including but not limited to laser drilling, mechanical drilling, and techniques based on photo definition. Via holes are subsequently partially or wholly filled or coated with a conductive material, usually metal. Such via structures may be blind, buried, through-hole and may or may not include pads on the conductive layers, as is well known to those skilled in the art of PCB design.

Sensitive components on a printed circuit board can be damaged by transient occurrences of electrostatic discharges (ESD). An ESD is characterized by a rapid rise in the order of tens of kilovolts in a few picoseconds, for example. Other transient phenomena with lower peak voltage levels and slower rise-times can also cause damage to the printed circuit board. For example, a sudden rise in voltage can be caused by a poorly grounded soldering iron, or a power switching relay, or a lightning strike on telecommunication lines that are connected to the printed circuit board. The term "transient" as used herein encompasses not only ESD events but any phenomena, of short duration, that directly or indirectly induces voltages and currents into a printed circuit board and where the amplitudes of such voltages and currents are high enough to cause degradation or failure of the electronic components on the printed circuit board.

FIG. 1A is a schematic that illustrates a printed circuit board 102 protected by conductive guard rings 104. Printed circuit board (PCB) 102 has a length L and a width W. In FIG. 1A, conductive guard rings 104 (only one of which is visible in FIG. 1) are added to the periphery of each outer layer of PCB 102 and one or more discrete transient protection devices can be attached to PCB 102. The guard rings 104 are attached to the chassis ground at the location where I/O connectors 106 are mounted to PCB 102. Typically, when a person picks up a PCB, the person will initially touch the periphery of the PCB. By positioning guard rings 104 along the periphery of PCB 102, guard rings 104 re-direct undesired transient currents to chassis ground. Thus, detrimental currents are not allowed to flow to transient sensitive components on PCB 102. However, guard rings fail to protect interior surfaces 112 of PCB 102. Another form of transient protection is the use of discrete transient protection devices.

Discrete transient protection devices such as discrete transient protection devices 108 can be attached to PCB 102 at the location where signal and/or power lines enter PCB 102, such as connector 106. However, discrete transient protection devices consume valuable real estate on the PCB. For example, U.S. Pat. No. 6,657,532 discloses discrete over-voltage protection components made of a thin layer of neat dielectric polymer or glass positioned between a ground plane and an electric conductor. U.S. Pat. No. 6,657,532 also discloses discrete over-voltage protection components having multi-layers of variable voltage material. Another non-limiting example of a discrete transient protection device is a resettable polymeric-positive-temperature-coefficient (PPTC) device. Like fuses, PPTC devices help protect circuitry from overcurrent damage. However, discrete PPTC devices consume valuable real estate on the PCB.

Other forms of transient protection include on-chip transient protection devices 110, such as zener diodes, for example. However, such on-chip transient protection devices do not have sufficient capacity to effectively dissipate large transient events. Both discrete and on-chip transient protection devices often have excessive amounts of intrinsic capacitance that makes such devices unsuitable for use in high speed applications. The primary protection mechanism of both discrete and on-chip transient protection devices is through the conversion of undesired transient energy into heat. Thus, large transient magnitudes and/or repeated exposure to large transient magnitudes are likely to result in over-heating that in turn results in performance degradation of such devices.

FIG. 1B is a cross section 150 of the PCB 102 of FIG. 1A taken at 1B. Cross section 150 shows that the PCB comprises multi-layers 160 of material. Cross section 150 also shows guard ring 104, on-chip transient protection device 110, connector 106 and discrete protection devices 108.

According to certain embodiments of the invention, a voltage switchable dielectric material (also referred to as "VSDM") can be used as transient protection material. In the past, voltage switchable dielectric material was used to make an insulating substrate that can be made conductive. When conductive, the voltage switchable dielectric material is amenable to electrochemical processing such as electroplating for making conductive traces. Such a method is disclosed by U.S. Pat. No. 6,797,145. Thus, while U.S. Pat. No. 6,797,145 discloses the use of voltage switchable dielectric material as an insulating substrate that can be made conductive for making conductive traces, U.S. Pat. No. 6,797,145 briefly suggests the use of voltage switchable dielectric material as a transient protection material.

Thus, in view of the foregoing, an effective form of transient protection is needed.

SUMMARY OF EXEMPLARY EMBODIMENTS

In certain exemplary embodiments, a printed circuit board (PCB) with integrated transient protection comprises a transient protection material that is selectively deposited on portions of one or more planes selected from a signal plane, a power plane and a ground plane, or any combination thereof. The selectively deposited transient protection material is in contact with a conductive material in any of the one or more planes and bridges conductive elements within the PCB.

In certain embodiments, by way of non-limiting examples, the different deposits of the selectively deposited transient protection material have variable characteristics depending on the location of the deposit in relation to transient sensitive components on the PCB and depending on the level of protection that is needed by the transient sensitive component.

One advantage of using such selectively deposited transient protection material to direct excess current to a ground, signal, or power distribution plane is that such a distribution plane acts as a heat sink and thus ameliorates degradation of transient sensitive electronic components on the PCB.

These and other embodiments and other features disclosed herein will become apparent to those of skill in the art upon a reading of the following descriptions and a study of the several figures of the drawing.

BRIEF DESCRIPTION OF THE DRAWINGS

FIG. 5A is a schematic that illustrates the protection of a circuit trace from transients by using selectively deposited transient protection material to contact a portion of the circuit trace.

FIG. 5B is a graph that illustrates the unsafe voltage levels of regions that are not protected by selectively deposited transient protection material and clamped voltage levels for regions that are protected by selectively deposited transient protection material.

FIG. 6 is a block diagram that illustrates transient protection material selectively deposited between conductive portions of a distribution plane or between distribution planes, coated on the same layer of a PCB.

FIG. 7 is a block diagram that illustrates transient protection material selectively deposited between conductive portions and a via pad coated on the same layer of a PCB.

DETAILED DESCRIPTION

According to certain embodiments, transient protection can be instituted by selectively depositing transient protection material into a PCB stackup. Such selectively deposited transient materials are herein referred to as transient protection materials. Transient protection materials are voltage switchable dielectric materials comprising base polymers that include silicon rubber, epoxy, polyimide, teflons and other polymers which are electrical dielectrics in their steady state but become electrically conductive when excited by a certain level of voltage or current The transient protection materials may be in the form of any shape that is useful for protecting components on a PCB and that can be deposited on one or more layers of material in the PCB stackup, whether on the outer surface of the stackup or on internal layers of the stackup. Further, the selectively deposited transient materials in a given PCB stackup may have different properties depending on the location on the stackup at which the transient material is deposited.

Figure 1A:
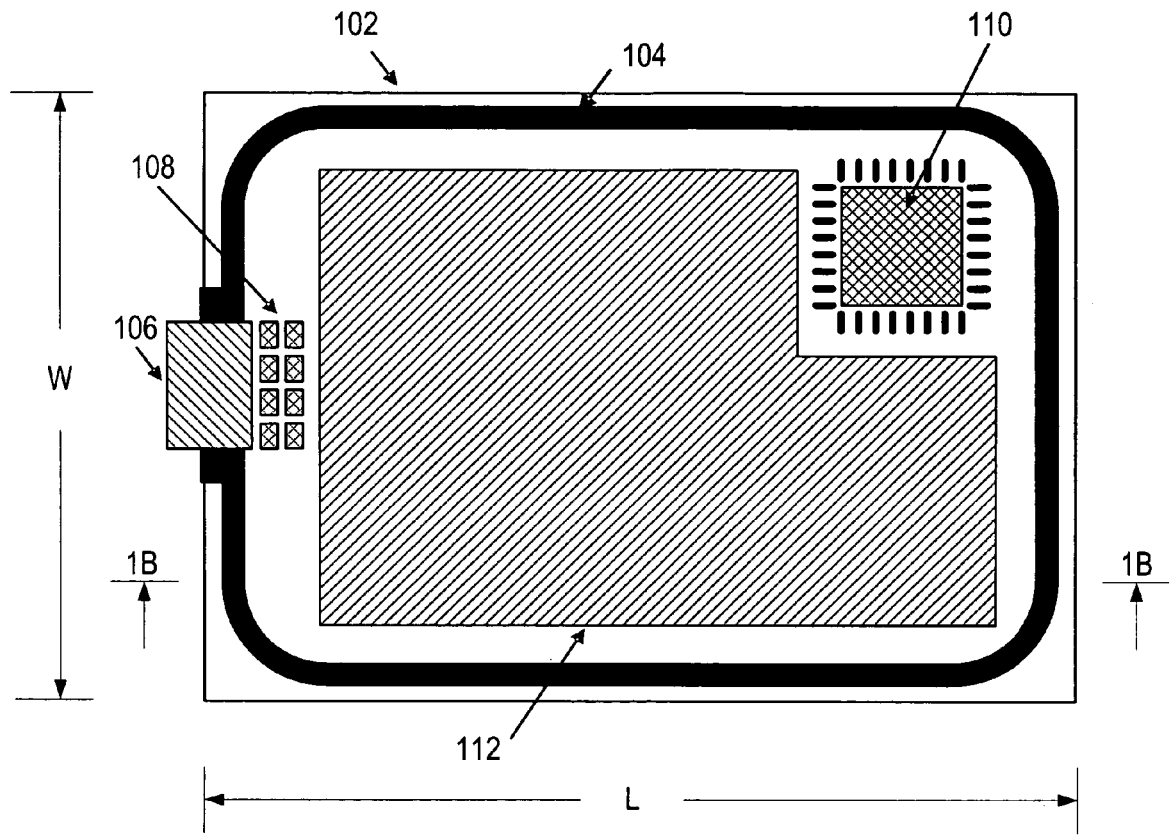
FIG. 1A is a block diagram that illustrates a printed circuit board protected by a conductive guard ring.
Figure 1B:
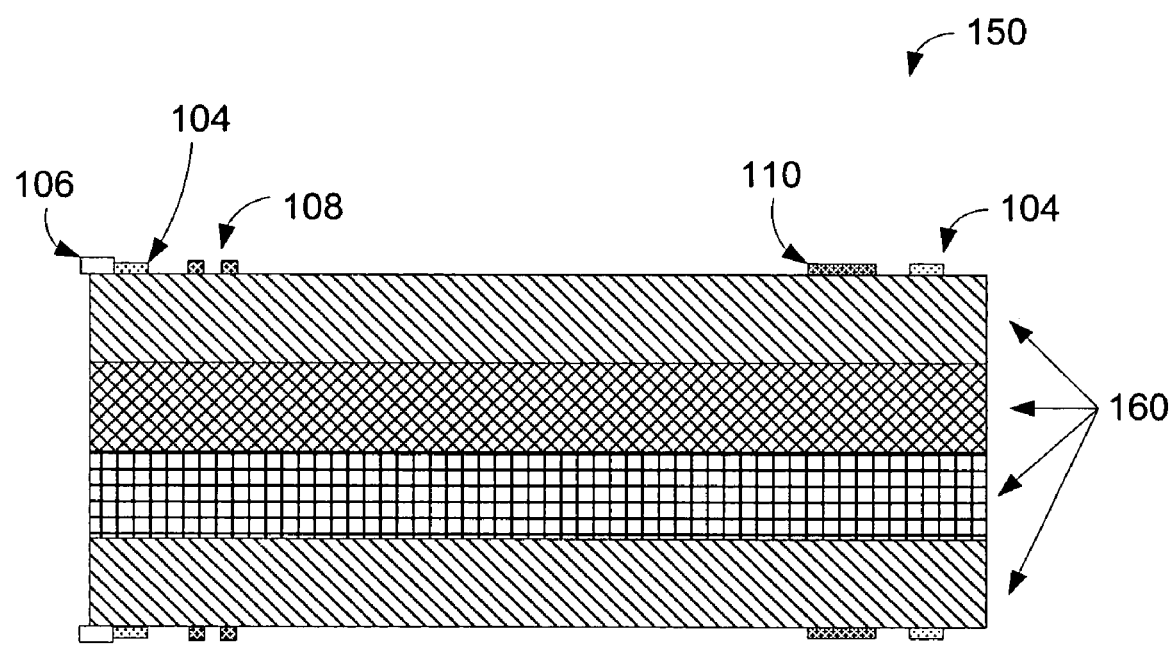
FIG. 1B is a cross section of PCB 102 of FIG. 1A taken at 1B.
Figure 2:
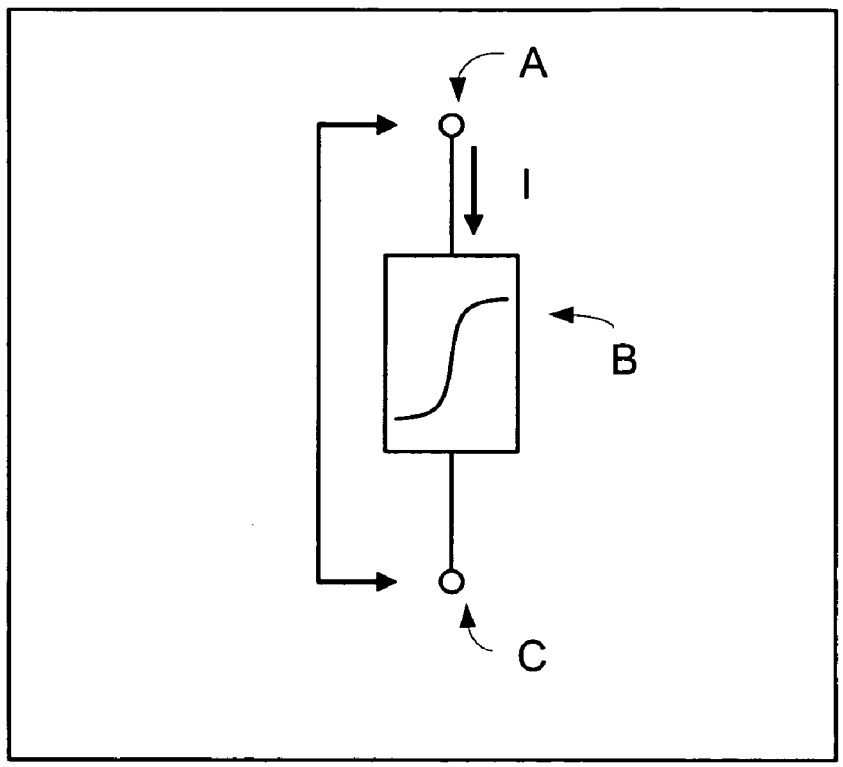
FIG. 2 is a schematic that illustrates a polymer region between two contact regions of a circuit that requires protection from transients.

FIG. 2 is a schematic that illustrates a polymer region (transient protection region) between two contact regions A and C of a circuit where protection from transients is needed. In FIG. 2, symbol B indicates a region of selectively deposited embedded transient protection material. In FIG. 2, region A and region C schematically represent the two contact regions where the transient protection polymer is attached to the circuit that needs protection from over-currents or over-voltages. Regions A, B and C are volumetric regions within a given PCB stackup rather than discrete points.

Figure 3A:
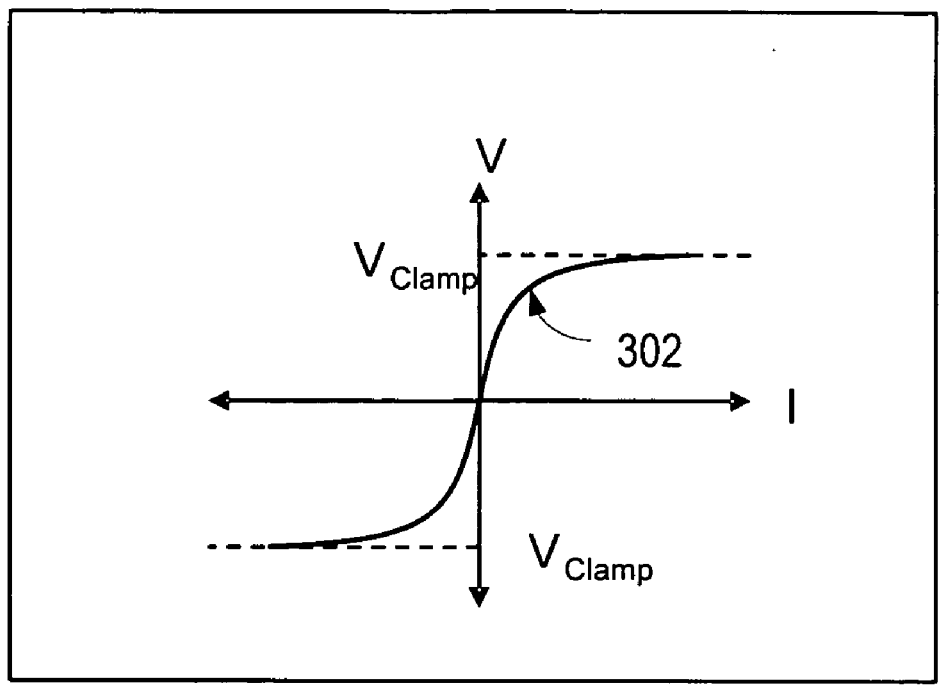
FIG. 3A is a graph that illustrates voltage clamping provided by embedded transient protection material.

According to certain embodiments, the selectively deposited transient protection material behaves in a bi-directional manner in that the material has the capability of clamping both positive and negative transients. FIG. 3A is a graph that illustrates voltage clamping provided by the selectively deposited transient protection material. The resistance of the selectively deposited transient protection material that offers bi-directional protection changes in response to applied voltage in the manner as indicated in FIG. 3A.

In FIG. 3A, resistance is represented by the slope of curve 302. A steep slope corresponds to a high resistance. Likewise, a shallow slope corresponds to a low resistance. During normal operation, the voltage experienced by the transient protection region is low and the corresponding resistance is high. However, when the transient protection region encounters a high transient voltage event, the resistance of the transient protection polymer material decreases and consequently allows more current to flow through the transient protection region. The decrease in resistance in the transient protection region limits the peak excursion of the transient voltage by clamping the transient voltage to a safe level while simultaneously re-directing the currents associated with the transient voltage to a nearby low impedance reference planar region. As known to those skilled in the art, the low impedance reference planar region is in most cases a chassis ground plane but may also may be a power distribution plane, a signal plane, V-ground plane, an analog ground plane, a digital ground plane, or a lower voltage power distribution plane.

Figure 3B:
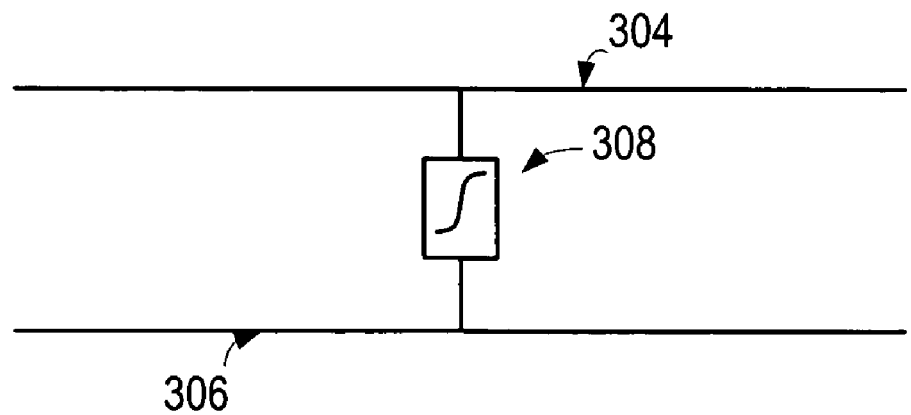
FIG. 3B is a schematic that illustrates the placement of transient protection material for purposes of limiting voltage levels, according to certain embodiments.

FIG. 3B is a schematic that illustrates the placement of transient protection material for purposes of limiting voltage levels, according to certain embodiments. FIG. 3B shows that the transient protection material 308 is positioned in parallel between the conductive material 304 and a low impedance reference plane 306.

Figure 4A:
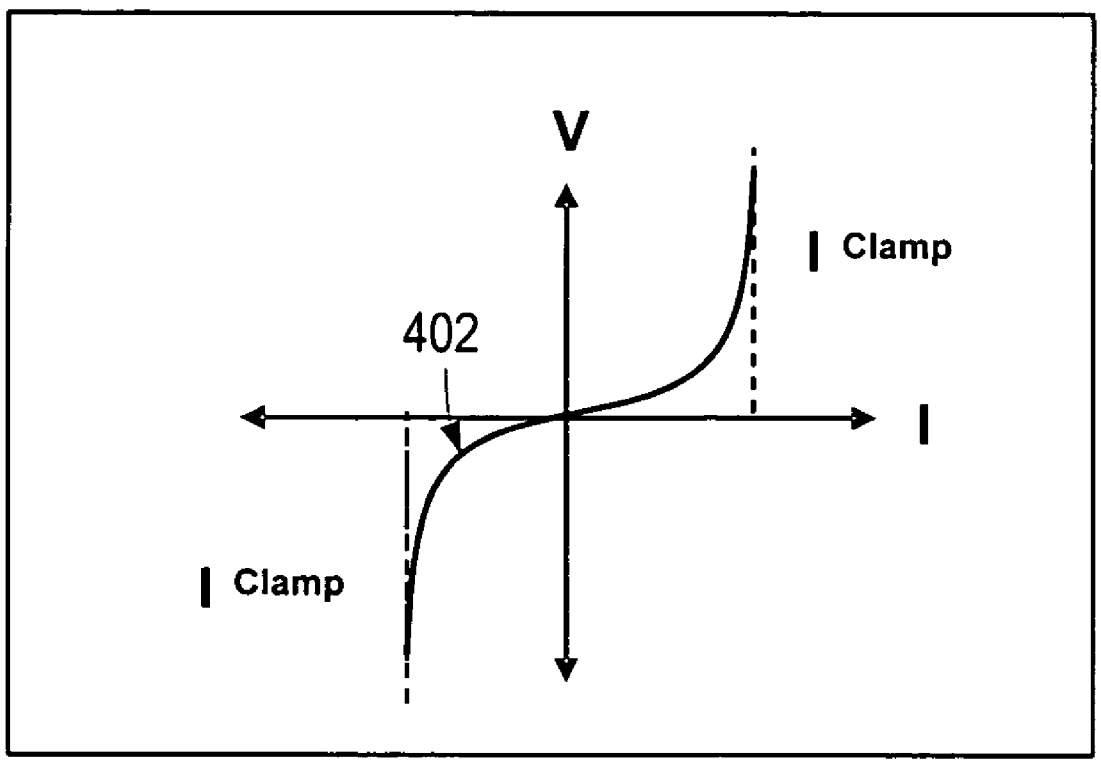
FIG. 4A is a graph that illustrates current clamping provided by the selectively deposited transient protection material.

FIG. 4A is a graph that illustrates current clamping provided by the selectively deposited transient protection material. In FIG. 4A, resistance is represented by the slope of curve 402. A steep slope corresponds to a high resistance. Likewise, a shallow slope corresponds to a low resistance. During normal operation, the resistance of the transient protection region is low. However, when the transient protection region encounters a high transient current, the resistance of the transient protection polymer material increases and consequently allows less current to flow through the transient protection region. Thus, the increase in resistance in the transient protection region limits the peak current to a safe level.

Figure 4B:
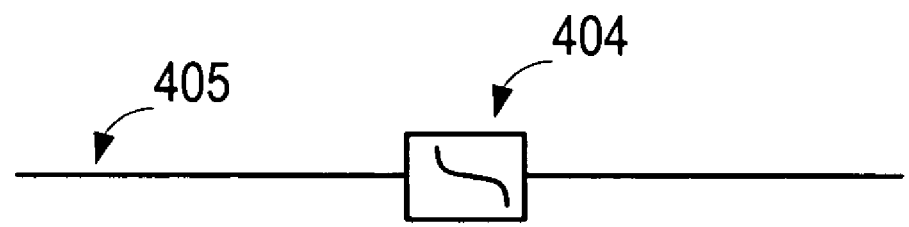
FIG. 4B is a schematic that illustrates the placement of transient protection material for purposes of limiting current levels, according to certain embodiments.

FIG. 4B is a schematic that illustrates the placement of transient protection material for purposes of limiting current levels, according to certain embodiments. FIG. 4B shows that the transient protection material 404 is positioned in series in a signal plane 405.

When the transient protection material is selectively deposited across the PCB, many protection points can be incorporated into the PCB. FIG. 5A is a schematic that illustrates the protection of a circuit trace from transients by using selectively deposited transient protection material to contact a portion of the circuit trace. FIG. 5A shows PCB region 500, victim circuit 504, victim circuit reference 506, and embedded protection region 508. For purposes of explanation, assume that a transient voltage 502 enters PCB region 500 at victim circuit 504. The transient protection region 508 is incorporated in the middle of the interconnect. When transient protection region 508 encounters the transient 502, transient protection region 508 operates to clamp the peak voltage to a safe level. Any excessively high levels of current due to transient voltage 502 are shunted to the victim circuit reference which can be a ground plane or power plane, etc. In other words, the excess current associated with a transient event is re-directed to a low impedance reference plane.

FIG. 5B is a graph that illustrates the unsafe voltage levels of regions that are not protected by selectively deposited transient protection material and clamped voltage levels for regions that are protected by selectively deposited transient protection material. FIG. 5B shows a graph with voltage along the vertical axis 509a and current on the horizontal axis 509b. When a transient voltage, such as transient voltage 502, enters the PCB, voltage levels are at unsafe levels 510. However, when the transient voltage encounters the transient protection region such as transient protection region 508, the voltage is clamped to a safe level 512.

The use of transient protection material in PCBs involves two major aspects. First, the transient protection material needs to be optimally positioned within the PCB stackup. Second, the conductive trace and via geometries used for connecting the deposited VSDM or transient protection material to the circuits must be added.

According to certain embodiments, the transient protection material can be selectively deposited on surfaces of laminates and cores Selective deposition of the transient protection material can be accomplished through screen printing, stenciling, needle dispensing, or ink jet printing, for example. Such methods of selective deposition will deposit prescribed volumes and geometries of VSDM or transient protection material, which are subsequently cured using appropriate curing methods. Deposits of variable performing polymers may be deposited on the same layer or on different layers within the PCB. Because the deposit is selective, a reduced amount of material is required, and thus results in cost savings. The manufacturing techniques for the structures illustrated in FIG. 6 and FIG. 7 may vary from implementation to implementation.

FIG. 6 and FIG. 7 illustrate structures that include at least one region of selectively deposited transient protection material. FIG. 6 is a block diagram that illustrates transient protection material selectively deposited between conductive portions of a distribution plane or between distribution planes, coated on the same layer of a PCB. FIG. 6 shows a layer of conductive material 602 on which transient protection material 604 is selectively deposited. FIG. 6 also shows a layer of dielectric material 606.

FIG. 7 is a block diagram that illustrates transient protection material selectively deposited between conductive portions and a via pad coated on the same layer of a PCB. FIG. 7 shows transient protection material 704 selectively deposited between a conductive portion 702 such as a copper material and a via pad 706 on a conductive plane. The conductive plane is positioned on a dielectric material 708. The structures of FIGS. 7 and 8A can be stacked in a variety of ways so that the selectively deposited transient protection material can be on the surface of the PCB stackup or within the internal layers of the stackup.

Figure 8A:
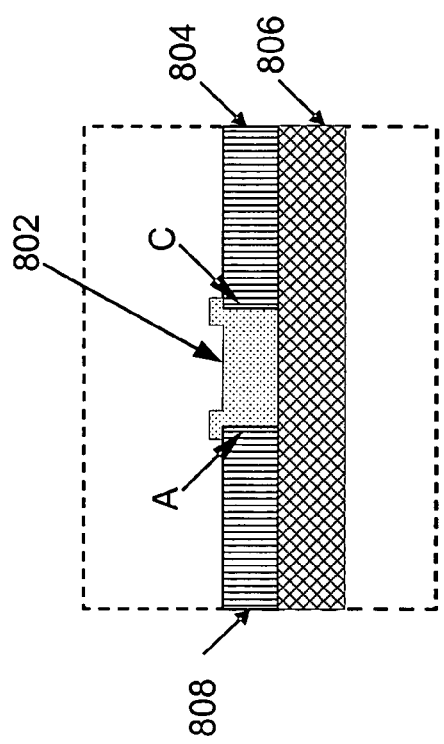
FIG. 8A is a block diagram that illustrates transient protection material selectively deposited between conductive portions such as two sections of copper material on a conductive plane.

FIG. 8A is a block diagram that illustrates transient protection material selectively deposited between conductive portions such as two sections of copper material on a conductive plane. In particular, FIG. 8A shows a cross section of a transient protection region comprising transient protection polymer 802 selectively deposited between conductive layers 804 and 808. FIG. 8A also shows a layer of dielectric material 806. FIG. 8A also shows contact regions A and C where the VSDM or transient protection material contacts conductive foils 804 and 808, respectively. The structure of FIG. 8A can provide transient protection for a variety of circuit topologies where two conducting regions are adjacent to each other and separated by a non-conductive region. Such regions are formed by traditional processes well known in the art for PCB fabrication such a photolithographic imaging and chemical etching, but can also be formed by other methods such as laser direct imaging or laser structuring. Examples of circuit topologies include but are not limited to transmission lines structures that are embedded in a distribution layer. Other non-limiting examples include slot lines, coplanar waveguides, edge-coupled differential pair transmission lines, moats of non-conductive areas separating different ground and power regions in distribution planes.

Figure 8B:
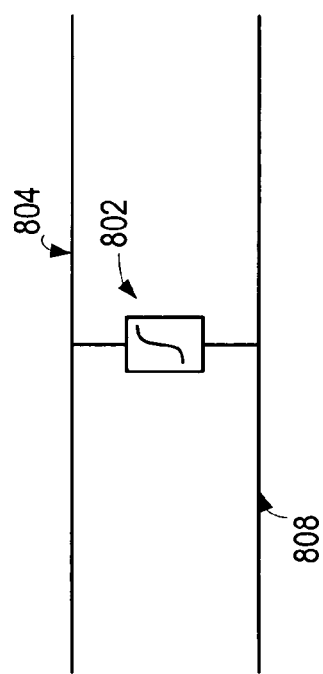
FIG. 8B is a schematic that illustrates the placement of transient protection material for purposes of limiting voltage levels, according to certain embodiments.

FIG. 8B is a schematic of FIG. 8A that illustrates the placement of VSDM or transient protection material for purposes of limiting voltage levels. In particular, FIG. 8B illustrates a circuit with conductive foil 804 adjacent to conductive foil 808. The VSDM or transient protection material 802 is deposited to bridge between the conductive foils 804 and 808.

Figure 9A:
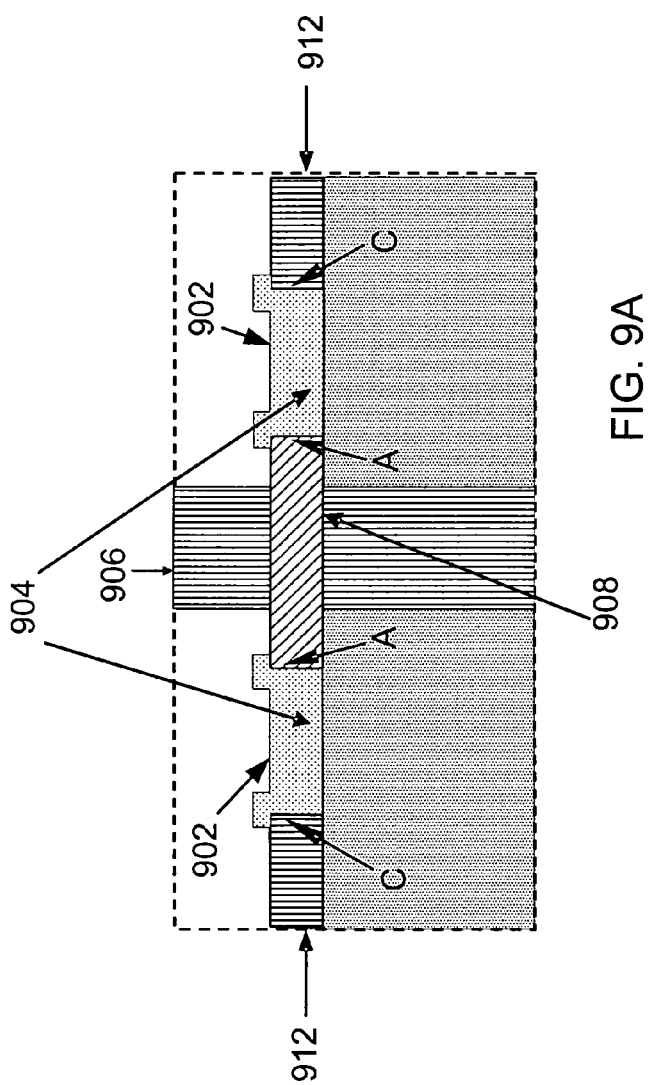
FIG. 9A is a block diagram that illustrates a transient protection region selectively deposited across a via anti-pad with a via pad present.

FIG. 9A is a block diagram that illustrates a transient protection region selectively deposited across a via anti-pad with a via pad present. The antipad and via pad form an annulus within a ground plane (but is not restricted to a ground plane) into which VSDM or transient protection material is selectively deposited. Such a geometry can be produced by using a print and etch process common to PCB fabrication on a copper clad laminate core. The copper clad laminate core is also referred to herein as a core layer structure. The copper clad laminate core can be glass reinforced with resin impregnation, random glass or fiber composite such as Dupont Thermount or it can be a film based material such as Dupont Kapton, The via pad area and antipad area can be coated with a precious metal or other deposit to reduce the contact resistance between the copper and VSDM interface. FIG. 9A shows a cross section of a transient protection region 902 that bridges an anti-pad region 904 of a via structure 906 with a via pad 908 present. FIG. 9A also shows contact regions A and C where the transient protection material contacts the via pad 908 and conductive material 912, respectively. Such a structure can be used to provide transient protection for a variety of circuit topologies where the conducting portion of the circuited to be protected is routed on the internal layers of the PCB stackup, or where the conducting portion of the circuit to be protected is on a different layer then the transient protection region in the PCB stackup. Each core layer structure with selectively deposited VSDM or transient protection material can then be laminated into a printed circuit board using conventional techniques known in the art. Thus the VSDM or transient material is embedded in the PCB stackup. Through-holes can be drilled into the PCB stackup. The through-holes can be plated with copper. Outer circuitry can be fabricated to connect pads onto which sensitive components can be subsequently assembled and connected to the embedded transient protection elements.

Figure 9B:
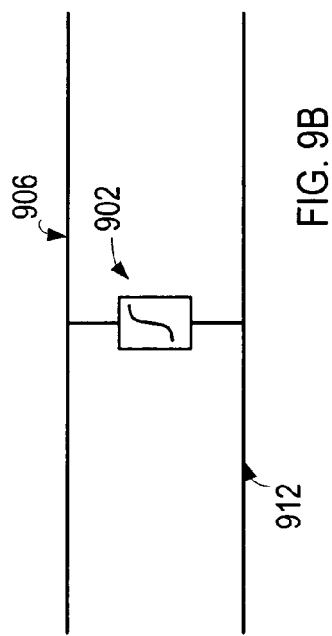
FIG. 9B is a schematic that illustrates the placement of transient protection material for purposes of limiting voltage levels, according to certain embodiments.

FIG. 9B is a schematic of FIG. 9A that illustrates the placement of VSDM or transient protection material for purposes of limiting voltage levels. In particular, FIG. 9B illustrates a circuit with conductive foil 912 adjacent to via pad 908. The VSDM or transient protection material 902 is deposited to bridge the area between the conductive foil 912 and the via pad 908.

Figure 10A:
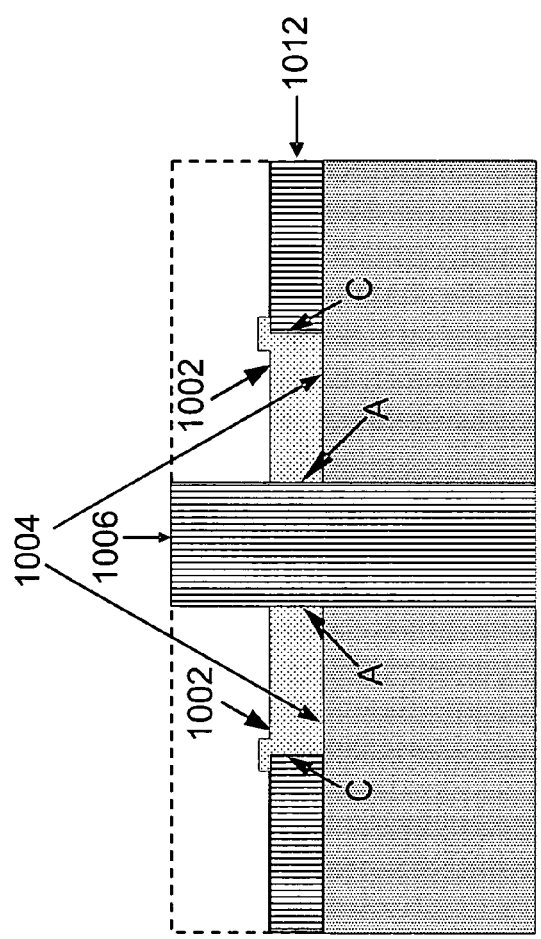
FIG. 10A is a block diagram that illustrates a transient protection region selectively deposited across a via anti-pad without a via pad present.

FIG. 10A is a block diagram that illustrates a transient protection region selectively deposited across a via anti-pad without a via pad present. FIG. 10A shows a cross section of a transient protection region 1002 that bridges an anti-pad region 1004 of a via structure 1006 that is without a via pad. Such a structure can be used to provide transient protection for circuits where non-functional pads are not present.

Figure 10B:
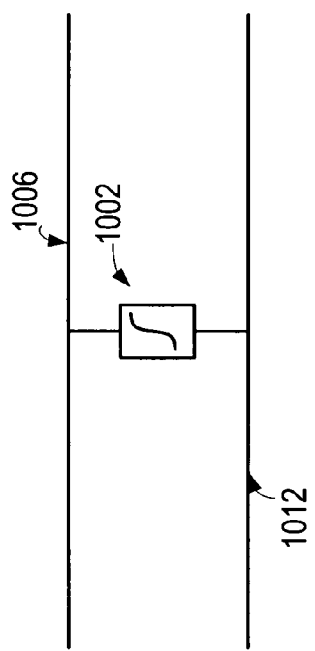
FIG. 10B is a schematic that illustrates the placement of transient protection material for purposes of limiting voltage levels, according to certain embodiments.

FIG. 10B is a schematic of FIG. 10A that illustrates the placement of VSDM or transient protection material for purposes of limiting voltage levels. In particular, FIG. 10B illustrates a circuit with conductive foil 1012 adjacent to via structure 1006. The VSDM or transient protection material 1002 is deposited to bridge between the conductive foil 1012 and the via structure 1006.

In certain embodiments of the core layer structure, the dielectric thickness is less then about 4 mils. If the conductive foil on one side of the dielectric is a ground plane and the conductive foil on the opposing side of the dielectric is a power plane, then the core layer structure has the added benefit of embedded distributed capacitance as well as selective transient protection. A further benefit is the reduction in plane inductance by bringing the power conductive layer closer to the ground conductive layer. In other words, as the dielectric layer becomes thinner, capacitance is increased and inductance is decreased. By increasing capacitance and decreasing inductance, quieter power distribution systems are produced, which in turn allow cleaner signals at higher frequencies. Some components, such as discrete capacitors, may further be removed from the surface of the PCB, thus reducing cost.

The amount of capacitance generated in this embedded planar capacitor is dependent upon the dielectric constants of the transient protection material and the dielectric used in the composite, the planar area of the power-ground conductive layer pair and the thickness of the composite. The amount of capacitance generated by this structure can be calculated as:

$$C = \frac{0.2244 \varepsilon_r A}{d}$$

where
C=capacitance in picofarads
A=area in square inches
$\varepsilon_r$=relative dielectric constant
d=dielectric thickness in inches It should be noted that the ranges of conductive material thicknesses, resin and transient protection material types and the presence of reinforcement or non reinforcement in the dielectric material as illustrated herein also apply to embedded distributed capacitors with transient protection.

In the foregoing specification, embodiments of the invention have been described with reference to numerous specific details that may vary from implementation to implementation. The specification and drawings are, accordingly, to be regarded in an illustrative rather than a restrictive sense.

We claim:

1. A printed circuit board with integrated transient protection, the printed circuit board comprising:
   a conductive via barrel; and
   a transient protection material selectively deposited on or in portions of a plane selected from a signal plane, a power plane and a ground plane, and wherein said selectively deposited transient protection material is in contact with and bridges a region between a conductive material in the plane and a via structure selected from the conductive via barrel and a via pad connected to the conductive via barrel, wherein the transient protection material forms part of a transient protection discharge path extending through the via structure.

2. The printed circuit board with integrated transient protection as recited in claim 1, wherein said transient protection material is deposited in one or more of an annular shape, closed curve, and polygon.

3. The printed circuit board with integrated transient protection as recited in claim 1, wherein said transient protection material comprises at least one of VSDM and resettable non-linear polymers having properties that protect against at least one of over voltage and over-current.

4. The printed circuit board with integrated transient protection as recited in claim 1, wherein said transient protection material behaves in a bi-directional manner for clamping both positive and negative transients in current or voltage.

5. The printed circuit board with integrated transient protection as recited in claim 1, wherein the via structure comprises the via pad, and wherein said conductive material and said via pad are on or in the plane.

6. The printed circuit board with integrated transient protection as recited in claim 1, wherein the via structure comprises the conductive via barrel.

7. The printed circuit board with integrated transient protection as recited in claim 1, wherein said conductive material comprises copper with a thickness in a range of 3 microns to 10 mils.

8. The printed circuit board with integrated transient protection as recited in claim 1, wherein said transient protection material possesses variable characteristics depending on proximity to sensitive components on said printed circuit board.

9. A method for making a printed circuit board with integrated transient protection, the method comprising:
   printing and etching a copper clad core material comprising any one of resin impregnated fiberglass cloth, random fiber and film material;
   selectively depositing a transient protection material on or in portions of a plane selected from a signal plane, a power plane and a ground plane, and wherein said selectively deposited transient protection material is in contact with and bridges a region between a conductive material in the plane and a via structure selected from a via pad and a conductive via barrel, wherein the transient protection material forms part of a transient protection discharge path extending through the via structure; and
   laminating said copper clad core into a multilayer PCB structure and completing a fabrication process of said PCB by: drilling holes, depositing conductive seed, imaging, plating-, and etching outer layer copper to form component mounting pads connected to elements of selectively deposited transient protection material.

10. The method as recited in claim 9, wherein said transient protection material is deposited in one or more of an annular shape, closed curve, and polygon.

11. The method as recited in claim 9, wherein said transient protection material comprises at least one of resettable non-linear polymers and VSDM having properties that protect against over voltage, and over-current.

12. he method as recited in claim 9, wherein said transient protection material behaves in a bi-directional manner for clamping both positive and negative transients in current or voltage.

13. The method as recited in claim 9, wherein the via structure comprises the via pad, and wherein said conductive material and said via pad are on or in the plane.

14. The method as recited in claim 9, wherein the via structure comprises the conductive via barrel.

15. The method as recited in claim 9, wherein said conductive material comprises copper, and wherein an area where said transient protection material contacts said copper is coated with a precious metal to reduce or control contact resistance.

16. A system with integrated transient protection, the system comprising:
  a multi-layered printed circuit board having a length, a width and a cross-sectional area;
  a plurality of electrical components on one or more layers of said multi-layered printed circuit board, wherein said multi-layered printed circuit board comprises at least one signal region, at least one power region, and at least one ground region; and
  a transient protection material selectively deposited on or in portions of said one or more layers or regions, wherein said selectively deposited transient protection material is in contact with and situated between a conductive material in any of said one or more layers or regions and a via structure of a via traversing said one or more layers or regions, the via structure being selected from a via pad and a conductive via barrel, wherein the transient protection material forms part of a transient protection discharge path extending through the via structure.

17. A planar distributed capacitance structure with integrated transient protection, the planar distributed capacitance structure comprising:
  a subcomposite structure including multiple layers and a via traversing the multiple layers wherein said sub-composite structure includes transient protection material in contact with and situated between a via structure of the via and at least one layer of conductive material of the subcomposite structure, wherein the via structure is selected from a via pad and a conductive via barrel, wherein the transient protection material forms part of a transient protection discharge path extending through the via structure, and wherein the subcomposite structure has a capacitance of at least 100 picofarads per square inch.

18. The planar distributed capacitance structure as recited in claim 17, further comprising at least one layer of dielectric material with a thickness in a range of 0.1 mils to 4 mils.

19. The planar distributed capacitance structure as recited in claim 17, wherein said transient protection material is selectively deposited in portions of said sub-composite structure and is in contact with the at least one layer of conductive material.

20. A system with integrated transient protection, the system comprising:
  a multi-layered planar distributed capacitance structure having a length, a width and a cross-sectional area; and
  a plurality of electrical components on one or more layers of said multi-layered planar distributed capacitance structure;
  wherein said multi-layered planar distributed capacitance structure comprises at least one sub-composite structure, wherein said sub-composite structure includes transient protection material in contact with and situated between a via structure and a region of a layer of conductive material, the via structure being selected from a via pad and a conductive via barrel, the transient protection material forming part of a transient protection discharge path extending through the via structure, the sub-composite structure having a capacitance of at least 100 picofarads per square inch.

21. The system as recited in claim 20, the multi-layered planar distributed capacitance structure further comprising at least one layer of dielectric material with a thickness in a range of 0.1 mils to 4 mils.

* * * * *